United States Patent [19]

Anderson et al.

[11] Patent Number: 4,610,027
[45] Date of Patent: Sep. 2, 1986

[54] METHOD FOR CONVERTING A BIT MAP OF AN IMAGE TO A RUN LENGTH OR RUN END REPRESENTATION

[75] Inventors: Karen L. Anderson, Peekskill; Gerald Goertzel, White Plains; Joan L. Mitchell, Ossining, all of N.Y.

[73] Assignee: International Business Machines Corporation, Armonk, N.Y.

[21] Appl. No.: 567,218

[22] Filed: Dec. 30, 1983

[51] Int. Cl.$^4$ .............................................. G06K 9/36
[52] U.S. Cl. ....................................... 382/56; 358/260; 358/261
[58] Field of Search ......................... 358/260, 261, 262; 382/56

[56] References Cited

U.S. PATENT DOCUMENTS

| | | | |
|---|---|---|---|
| 3,980,809 | 9/1976 | Cook | 178/6 |
| 4,121,259 | 10/1978 | Preuss et al. | 358/261 |
| 4,207,599 | 6/1980 | Murayama et al. | 358/261 |
| 4,327,379 | 4/1982 | Kadakia et al. | 358/261 |
| 4,386,373 | 5/1983 | Kondo et al. | 358/260 |
| 4,516,173 | 5/1985 | Abe et al. | 358/261 |

Primary Examiner—Leo H. Boudreau
Assistant Examiner—Jacqueline Todd
Attorney, Agent, or Firm—George E. Clark; Thomas P. Dowd

[57] ABSTRACT

A method for converting an image from a bit map to a run end or run length representation includes the steps of: storing said image as a bit map representation; initializing all variables to be used in the conversion process; converting by table lookup, each run of continuous color to a run representation, storing, in a run representation buffer, as a count value, each run representation; repeating the steps of converting and storing for each run of continuous color to the end of the image.

19 Claims, 5 Drawing Figures

Run End Representation of Image Data

Binary Image

```
11111111 11000000 00000000 00010000
00000000 00000000 00000000 00000000
10100000 10001111 11111111 11110001
```

Run End Buffers (Two-Byte Entries)

```
24   0   0   0   0  10  27  28  32  32  32  32
16   0   0   0  32  32  32  32
32   0   0   0   0   1   2   3   8   9  12  28  31  32  32  32
```

— Two copies of last black run end
— First black run end
— First white run end
— Three zero entries
— Number of bytes of data in run end buffer

Variables for Conversion Algorithm

NCOL, LIM, LFTPAD, RTPAD, and XSKIP are specified in bits
LINELEN is specified in bytes
PWORD is a four-byte unit in storage
IMGPT is a pointer W is the size of a storage element, in bytes
Subscripted W and B values indicate white and black runends
$N = W * ((2 * K) + 6)$
$B_K = NCOL$
$W_K = NCOL$ if the last run in the line is white

METHOD FOR CONVERTING A BIT MAP OF AN IMAGE TO A RUN LENGTH OR RUN END REPRESENTATION

BACKGROUND OF THE INVENTION

1. Field of the Invention

The present invention relates to digital image processing methods and more particularly to methods for converting an image from a bit map representation to a run end or run length representation.

2. Description of the Prior Art

Although there are many image manipulation methods in the prior art, none is known which teaches or suggests the method of the present invention.

SUMMARY OF THE INVENTION

Therefore, it is an object of the present invention to convert an image from a bit map to a run end or run length representation by a method comprising the steps of: storing the image as a bit map representation; initializing all variables to be used in the conversion process; converting each run of continuous color to a run end or length representation; storing, in a run representation buffer, as a count value, each run representation; repeating the steps of converting and storing for each run of continuous color to the end of the image.

It is another object of the present invention to convert an image bit map to a run end or run length representation by a method as above further including the step of: inserting padding at a beginning or an end of each line in accordance with a predetermined format.

It is yet another object of the present invention to convert an image bit map to a run end or run length representation by a method as above further including the step of: testing one or more contiguous bytes of image data for all bits having a same value to reduce processing time for long runs of continuous color.

Accordingly, a method for converting an image from a bit map to a run end or run length representation includes the steps of: storing said image as a bit map representation; initializing all variables to be used in the conversion process; converting by table lookup, each run of continuous color to a run end or run length; storing, in a run representation buffer, as a count value, each run end or run length; repeating the steps of converting and storing for each run of continuous color to the end of the image.

The foregoing and other objects, features and advantages of the invention will be apparent from the more particular description of the preferred embodiments of the invention, as illustrated in the accompanying drawing.

BRIEF DESCRIPTION OF THE DRAWING

In the drawing, like elements are designated with similar reference numbers, and identical elements in different specific embodiments are designated by identical reference numbers.

DESCRIPTION OF PREFERRED EMBODIMENTS OF THE INVENTION

The problem considered here is that of quickly converting a binary image represented as a bit map (8 pels/byte) in storage into a series of vectors of run ends or run lengths (one vector for each line of image data). The run ends are the displacements in bits (i.e. pels) from the left edge of the image to the last pel in each run.

The algorithm proposed uses a novel method of finding the run lengths by a table lookup, exploits the fact that a binary image typically includes large areas containing only zero (white) picture elements, and uses the technique of forcing processing at the right edge of the line into a rarely used path to avoid frequent testing for the end of a line of image data. This permits the creation of code which is significantly faster than current methods.

Figure 1:
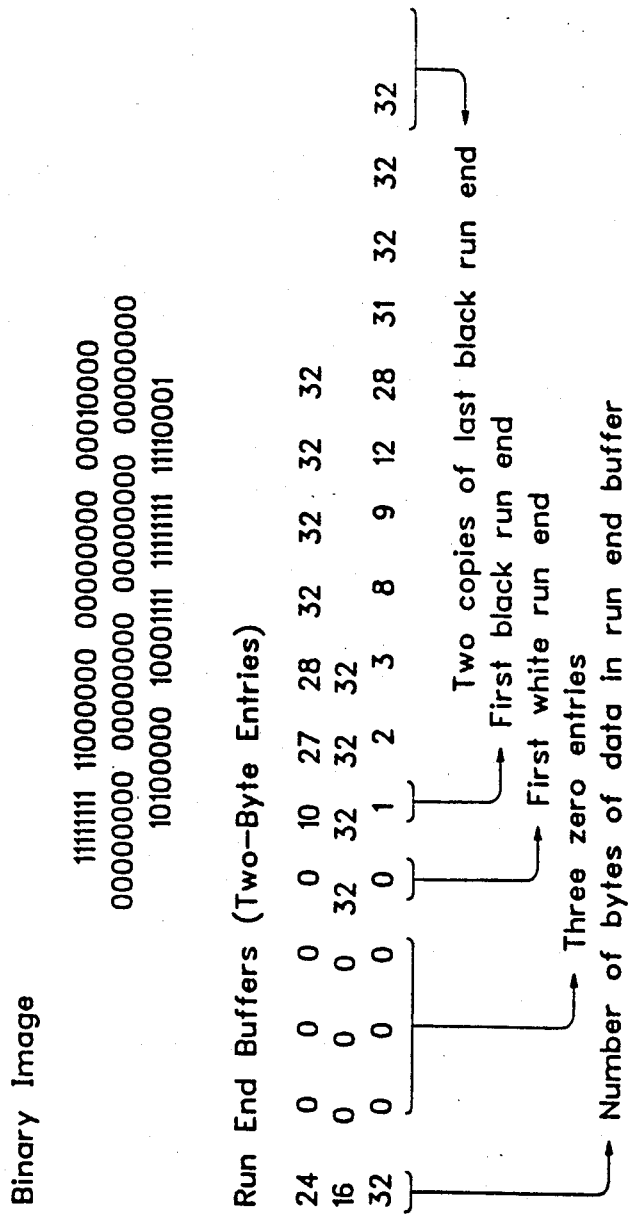
FIG. 1 is a chart showing binary bit string and run end representation of image data in accordance with the present invention.

Referring now to FIG. 1, the conversion formats are described. The bits making up the image are assumed to be stored packed eight to a byte, with each line beginning and ending on a byte boundary. The lines are assumed to be arranged sequentially in storage. It is possible to skip data at the beginning and/or end of the line by appropriate initializations. Thus the image represented in the run end/run length vectors does not have to start or stop on byte boundaries. It is also possible to convert the image as if it were padded on either the right and/or left edges with either zero or one bits.

This method may be used to generate either run ends or run lengths to represent the image. The description which follows will assume that run ends are desired. In order to produce run lengths, the variable which contains the current run end would simply be set to zero before each new value is calculated.

The preferred embodiment creates a run end buffer for each line which contains a series of halfwords. The 16 bits in the halfword are adequate to represent images with widths up to 32K as positive displacements. The first halfword in each line buffer gives the number of bytes of run end data plus two bytes for the count (i.e. the total number of bytes of data in the buffer); this is followed by three zero run ends, an arbitrary number of pairs of white/black run ends, and two additional copies of the last black run end. If the image row begins with a black run, the first white run end must be specified as zero. If the image row ends with a white run, the last black run end will be the same as the last white run end, so that we in fact have three additional copies of the last real run end. For example, if no skipping or padding is specified, the

| 11111111 | 11000000 | 00000000 | 00010000 |
| 00000000 | 00000000 | 00000000 | 00000000 |
| 10100000 | 10001111 | 11111111 | 11110001 | would produce three vectors with the following halfword entries:

| 24 | 0 | 0 | 0 | 0  | 10 | 27 | 28 | 32 | 32 | 32 | 32 |    |    |    |    |
|----|---|---|---|----|----|----|----|----|----|----|----|----|----|----|----|
| 16 | 0 | 0 | 0 | 32 | 32 | 32 | 32 |    |    |    |    |    |    |    |    |
| 32 | 0 | 0 | 0 | >0 | 1  | 2  | 3  | 8  | 9  | 12 | 28 | 31 | 32 | 32 | 32 |

Figure 2:
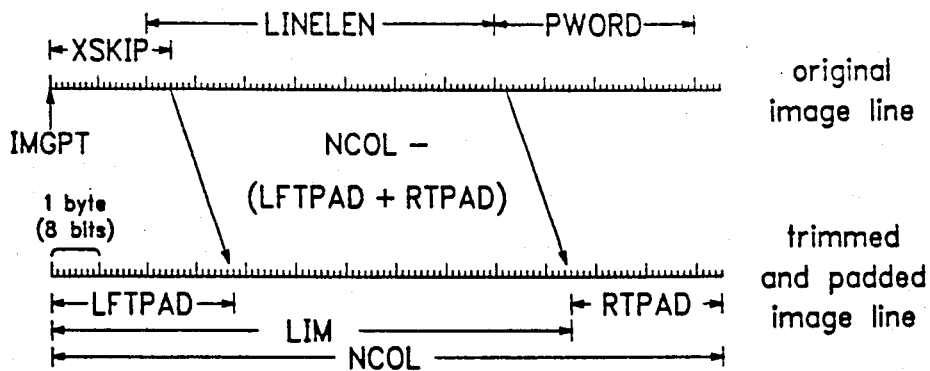
FIG. 2 is a chart showing the conversion formats and variables according to the present invention.
Figure 2:
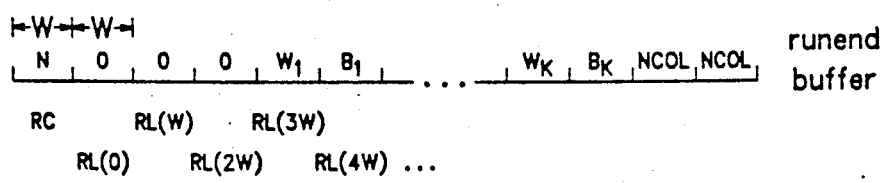

The variables used in the conversion algorithm are listed in Table 1; some of them are illustrated in FIG. 2. For the purposes of this discussion, the most important variables are the byte of image data which is currently being examined (referred to as BYTE); the number of bits of image data in the current line which have been processed (CT); the number of bits of data in BYTE which have already been processed (BITCT); the number of pels in the trimmed and padded image line (NCOL); the number of pels which will have been accounted for in the output image when all of the required input data has been processed (LIM); the number of bits of input data to be skipped on the left edge of each line (XSKIP); the number of padding bits to be inserted on the left and right (LFTPAD and RTPAD); and the color (white or black) of the padding bits to be inserted (PADCOLOR). For the simple case where no skipping or padding is performed, LIM and NCOL are both equal to the number of pels per line of image data.

TABLE I

VARIABLES FOR CONVERSION ALGORITHM

| | |
|---|---|
| BBITS | lookup table which returns the number of leading one bits in the byte used to index it |
| BITCT | number of bits of BYTE which have been processed |
| BYTE | byte of image data currently being processed |
| CT | number of bits represented by output data currently stored |
| IMGBYTE | byte whose address is given by IMGPT |
| IMGPT | pointer to input image data |
| LFTPAD | number of pad bits to be inserted on the left |
| LIM | number of pels accounted for in output line when all required input pels have been processed |
| LINELEN | offset of first byte containing image data which is not used from first byte containing image data which is used |
| NCOL | number of pels per line in the image represented by the output buffer |
| ORMASK | mask to fill 25-32 bits beyond end of input line with ones |
| P | pointer to byte containing first bit beyond end of input image line |
| PADCOLOR | representation of color of padding bits (white or black) |
| PWORD | four-byte unit whose address is given by P |
| RC | first unit in output buffer; gives number of bytes of data in output buffer for current line |
| RL | indexed variable of run ends; follows RC in output buffer |
| RTPAD | number of pad bits to be inserted on the right |
| RUNCT | number of bytes of runend data currently stored |
| SVPWORD | storage area where PWORD is saved |
| W | width of an individual storage element of RC and RL, in bytes |
| WBITS | lookup table which returns the number of leading zero bits in the byte used to index it |
| X | temporary variable |
| XSKIP | number of bits of image data to be skipped at the beginning of each line. |

The method processes one line of data at a time; it may be imbedded in a loop to process multiple lines. Before any lines are processed, some initializations are performed. These are shown in FIG. 2. First, IMGPT and XSKIP are adjusted so that IMGPT points to the first byte containing data which is to be used, and XSKIP has a value in the range from zero to seven. This adjustment is accomplished by incrementing IMGPT by one byte for each eight bits which are to be skipped, and reducing XSKIP accordingly. Second, the offset from the beginning of a line of the byte containing the bit immediately following the last bit of data to be used is obtained by adding XSKIP to the number of input bits required (given by NCOL−(LFTPAD+RTPAD)) and dividing by eight to convert to bytes. The resulting value is stored in LINELEN. The remainder from the division is used to shift the hexadecimal value FFFFFFFF right logically, producing a mask (ORMASK) which can be used to set the bits following the end of the line to ones. Finally, LIM is calculated by taking the difference of NCOL and RTPAD.

Figure 3:
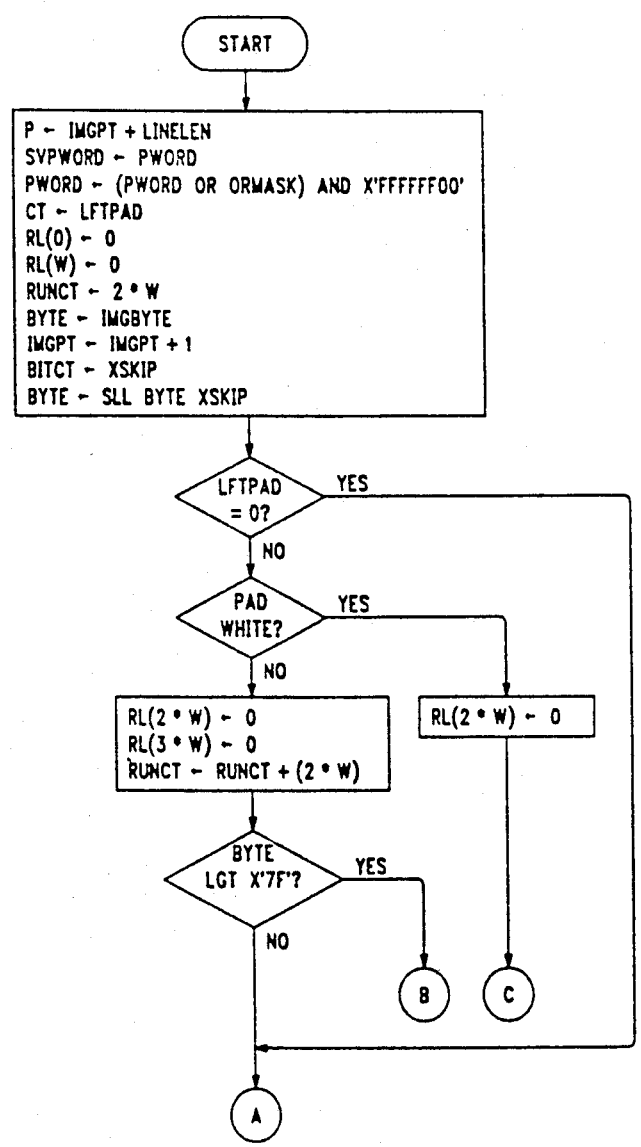
FIG. 3 is a flow diagram of the line initialization process of the method of the present invention.

The initializations performed before processing each line of image data are shown in FIG. 3. The four-byte word (PWORD) whose first byte contains the bit immediately beyond the end of the line to be converted is saved, and replaced in storage with a word having the following characteristics:

(1) The bits of image data which are to be coded are preserved;

(2) Immediately following those bits (if any) is a series of black bits of sufficient length that there is at least one byte which consists entirely of black bits and does not contain the first bit of the black run; and (3) There is at least one white bit following the series of black bits.

PWORD thus contains a black run which will force processing into the path which processes long black runs (i.e. runs containing at least one byte of black pels which does not include the first pel in the run). Since this path can only be entered when a black run of nine or more pels is encountered, and since such runs are relatively uncommon in typical images, the path is rarely used. By guaranteeing that we will be in this path at the end of each line, we can dispense with testing for the end of the line on all other paths. The elimination of these tests for most cases produces faster code.

We next initialize the pel counter CT to LFTPAD (so that the proper number of padding bits will be coded) and store the first two zeroes in the run end buffer. The first byte of image data is loaded into BYTE, the XSKIP pels which are to be skipped are shifted out, and BITCT is set to indicate that that number of pels in BYTE have been processed. (If BYTE is being maintained in a storage element, such as a register, which contains more than one byte, then any time data is shifted out of the byte which might contain one bits, those bits must be masked out by performing a logical AND of the storage element with the hexadecimal value 000000FF.)

Following this, we pad on the left of the input data if necessary. If we are padding with white, we store a third zero in the run end buffer and skip the storage of the initial run end at the top of the inner loop. If we are padding with black bits, we store a third zero in the run end buffer, followed by a zero indicating a null white run at the beginning of the line. We then test to see if the first bit of image data is black or white. If it is black, we proceed directly to the portion of the inner loop which processes a black run; if it is white, we drop through to the beginning of the inner loop, where the black run end is stored. Note that if no padding on the left is needed, CT will be zero and will be stored as the third zero in the run end buffer on entry to the inner loop.

Figure 4:
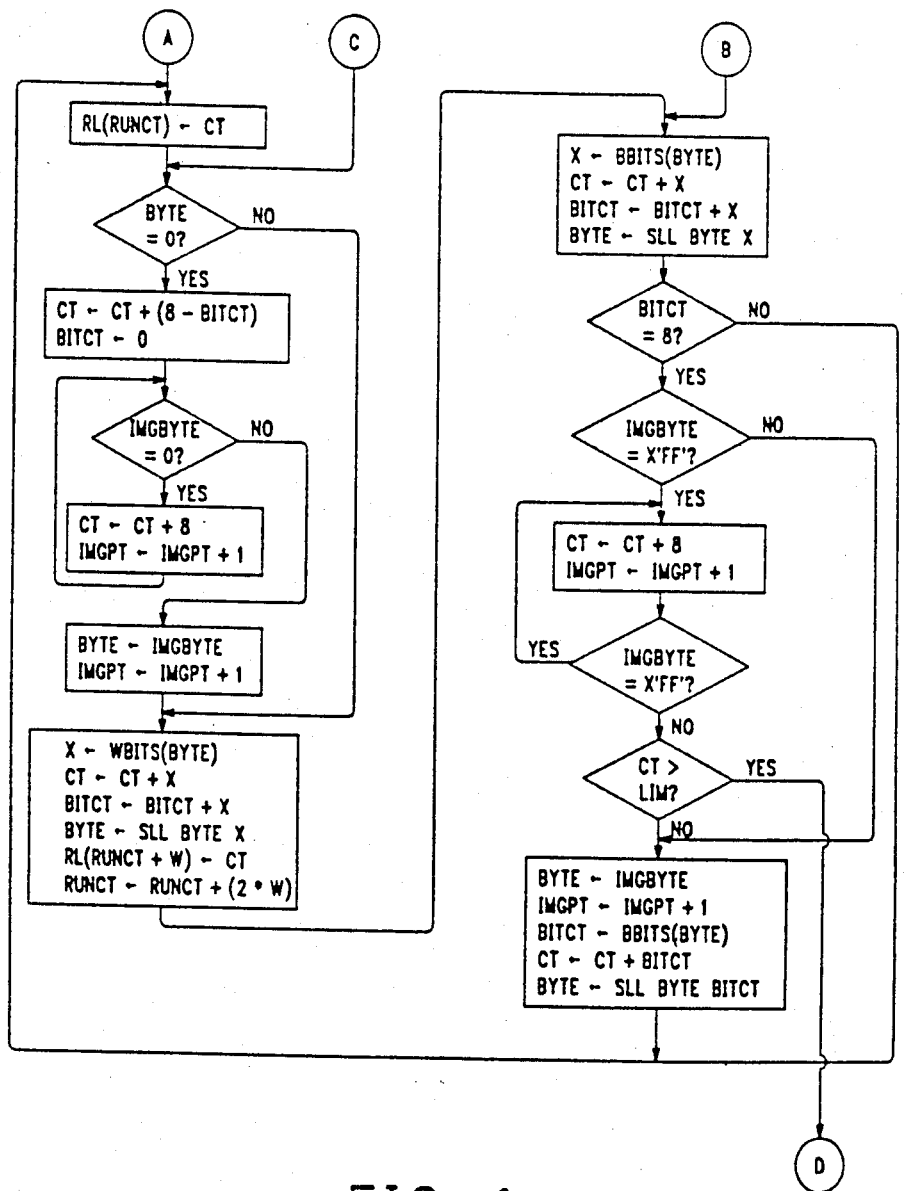
FIG. 4 is a flow diagram of the run pair processing of the method of the present invention.

FIG. 4 illustrates the inner loop in the conversion process, which handles one white run and the succeeding black run. The loop begins by storing the value of CT, which contains the black run end calculated during the previous iteration (or zero if this is the first iteration). BYTE is then tested to see if it contains only zeroes. If so, then the value 8-BITCT (i.e. the number of unprocessed bits remaining in BYTE) is added to CT, and BITCT is set to zero. A loop is then entered which checks to see if the next byte of image data contains only zero bits; if so, 8 is added to CT and the next byte of data is checked. When a nonzero byte is found, it is loaded into BYTE. Since typical images contain long runs of white pels, it is desirable to make use of special instructions available on many processors to scan a field of bytes for the first nonzero byte. The number of bytes skipped can then be determined, and CT incremented by eight times that amount.

Whether or not the original byte was zero, we now have a byte in BYTE which contains at least one black bit. To find where the white run ends, we use BYTE to index into a lookup table which returns for any byte the number of leading zero bits in that byte. This value is added to CT and to BITCT. CT now contains the location of the end of the white run, so it is stored. BYTE is shifted left by the number of bits indicated by the table lookup. At this point we also increment the pointer to the area where run ends are stored by twice the size of the data item stored for a run (since both a black and a white run end have been stored in this iteration of the loop).

We are now ready to process a black run. BYTE contains a byte with at least one leading black bit. To find where the black run ends, we use BYTE to index into a second lookup table which returns for any byte the number of leading one bits in that byte. This value is added to CT and BITCT, and BYTE is shifted left by the number of bits indicated.

We next test BITCT to see if it is 8. If not, then there are unprocessed zero bits in BYTE, and control returns to the top of the loop to process another white run. If BITCT equals 8, then all of the bits in the original byte of data have been processed. In this case we check to see if the next byte of image data contains only one bits. If so, we enter a loop which increments CT by eight and the pointer to the image data by one; it then checks to see if the next byte contains all one bits, and repeats the loop if it does. Execution of the loop continues until a byte containing one or more zero bits is found. We then check to see whether we have reached the end of the line of image data (by comparing CT to LIM), and leave the loop if we have.

We now have a byte of data which contains one or more zero bits, and we have not exhausted the input data. The byte is loaded into BYTE. We use BYTE to index into the second lookup table to determine how many leading one bits it contains; the resulting value is added to CT and loaded into BITCT. BYTE is shifted left by the number of bits indicated. Control then returns to the top of the loop.

Note that when the inner loop is exited, the final run end has been stored only if the final run was white. The color of the last run may be determined, if necessary, by comparing the last (white) run end stored with LIM: if they are equal, the last run was white, and the succeeding black run end has the value LIM, and if they are not equal, the last run was black and its run end is given by LIM.

Figure 5:
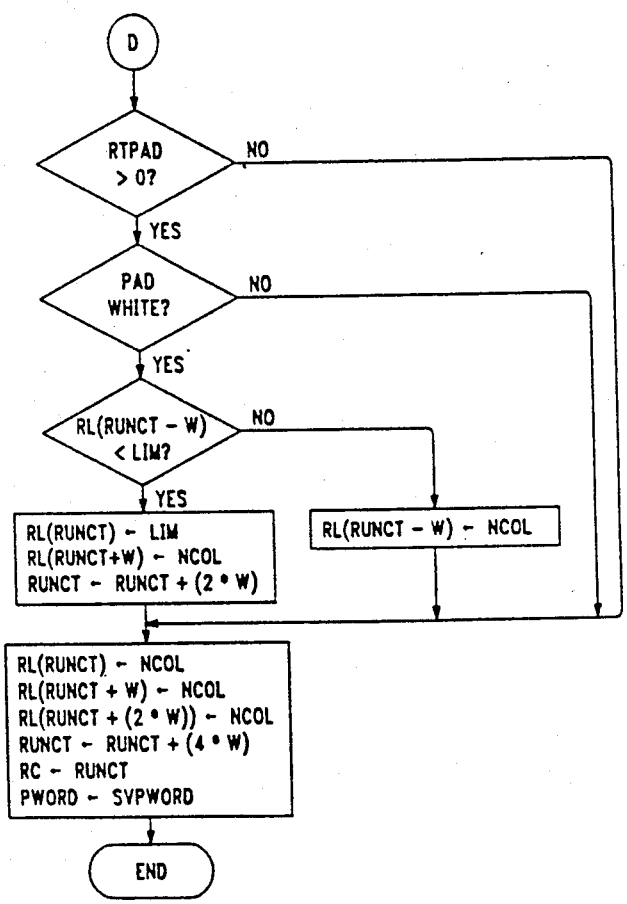
FIG. 5 is a flow diagram of the end of line processing of the method of the present invention.

The processing performed after exit from the inner loop is shown in FIG. 5. If the padding required on the right is either nonexistent or black, the last black run end is given by NCOL, since the black padding (if any) forms a run which extends from LIM to NCOL. In this case we can simply store three copies of NCOL. If the right padding is white, we look at the last (white) run end which was stored to see if it extended to the end of the real image data (LIM). If it did, it is replaced by the right edge value which includes the padding bits (NCOL). If it did not, the black run end following it is replaced by the value of the end of the image data (LIM), and a white run end of NCOL is stored following that. Processing continues with the storage of three copies of NCOL. For all cases, the number of bytes of run end data is stored, and the word which was modified to force the exit from the inner loop is restored. The next line of the image (if any) can then be processed.

Many variations on the basic conversion algorithm are possible. The processing may be simplified by requiring that some combination of the variable XSKIP, LFTPAD, and RTPAD are zero (for example, if RTPAD is zero then the need for separate variables LIM and NCOL disappears; a single variable can serve for both since they are always equal). The precise format of the output run end buffer required affects some of the details of the implementation. For example, if the three zeroes at the beginning of the output buffer are eliminated, then in the case where there is white padding on the left we could avoid the special processing which stores the third zero in the run end buffer and skips storage of the value of CT at the top of the inner loop; CT could be stored, and that information would later be overwritten by the number of bytes of data in the run end buffer. There is nothing in the algorithm which requires that the amount of data in the run end buffer be saved; a count of the number of run ends (rather than a byte count) could be stored, or no count could be stored at all. Thus, most of the operations outside of the inner loop are controlled by the assumptions made about the input image and by the format of the output data required. The inner loop is relatively independent of these considerations; the major variation within this loop would be the use of a different size unit of image data in place of BYTE. This unit may be any convenient size; however, it should be noted that for a unit of N bits, the lookup tables WBITS and BBITS contain $2^{**}N$ bytes, so that a large unit size may be impractical because of the amount of storage required for the tables.

Features of the method according to the present invention include the following:

By forcing an improbable occurrence (a long black run) at the right edge, the need to test for the end of a line is eliminated on all paths except the path which handles the improbable case. This drastically reduces the amount of testing required for a typical image, resulting in fast code.

By appropriate initializations, the input image can be trimmed and/or padded during the conversion using this algorithm.

Table lookup of the run ends for part of a run existing in a byte containing both black and white bits allows fast calculation of the run lengths. For long runs, the procedure of testing bytes in storage against a single value (X'00' or X'FF') makes it convenient to take advantage of the instructions available on many processors which perform such tests rapidly on a series of contiguous bytes. Both of these factors are helpful in obtaining code which executes rapidly.

This function requires the following input:

(1) Pointers to the image data and the space for the run end
buffer
(2) The number of lines of image data to be converted
(3) The distance (in bytes) from the beginning of one line of
the input image to the beginning of the next
(4) Values of the variables XSKIP, NCOL, LFTPAD, and RTPAD
(5) The color of the padding bits to be used.

The program embodying the present invention requires a single parameter PARM which gives the address of a list of nine parameters controlling the conversion. These parameters are stored in a 36-byte buffer; all parameters are full 4 byte words. FIXED(31) specifies a 4 byte value; PTR(31) indicates variables which will be addresses. The nine parameters are:

```
DCL
PARM                    PTR(31); DCL
1 LIST BASED(PARM),
  2 INIMAGE             PTR(31),
  2 RLBUF               PTR(31),
  2 NLINES              FIXED(31),
  2 IWID                FIXED(31),
  2 XSKIP               FIXED(31),
  2 NCOL                FIXED(31);
  2 LFTPAD              FIXED(31);
  2 RTPAD               FIXED(31);
  2 PADCLRW             FIXED(31);
```

INIMAGE—Pointer to the first byte (i.e. the upper left-hand corner byte) of the original image.

RLBUF—Pointer to the location where the first run end buffer is to begin.

NLINES—Number of lines of the original image which are to be converted.

IWID—Distance (in bytes) from the beginning of one line of the original image to the beginning of the next line of the original image.

XSKIP—Number of bits to be skipped on the left edge of the original shape.

NCOL—Number of pels per line in the (trimmed and padded) image represented by the output buffer.

LETPAD—Number of pad bits to be inserted on the left.

RTPAD—Number of pad bits to be inserted on the right.

PADCLRW—Color of the padding bits to be used for the padding specified by RTPAD and LFTPAD. If the low-order byte of PADCLRW is zero, zero (white) bits are used; otherwise one (black) bits are used. The high-order three bytes of PADCLRW are ignored.

This function converts an image to runends. For each line, the runend buffer produced contains a series of halfwords: the number of bytes of data (two bytes for the count and two bytes for each runend), three zeros, a number of pairs of white/black runends, and two additional copies of the last black runend. For example, if no padding or skipping is specified, the image

| ffc00010 | ffffe00f | 80008001 |
| 00000000 | 00000000 | 00000000 |
| a0affff1 | 0000003f | 807c0004 | would produce a runend buffer containing the following halfword entries:

| 36 | 0  | 0  | 0  | 0  | 10 | 27 | 28 | 32 | 51 |
| 60 | 65 | 80 | 81 | 95 | 96 | 96 | 96 | 16 | 0  |
| 0  | 0  | 96 | 96 | 96 | 96 | 52 | 0  | 0  | 0  |
| 0  | 1  | 2  | 3  | 8  | 9  | 10 | 11 | 12 | 28 |
| 31 | 32 | 58 | 65 | 73 | 78 | 93 | 94 | 96 | 96 |
| 96 | 96 |

The program embodying the present invention requires an area of storage to contain its variables. These variables are as follows:

| Variables in procedure storage | | |
|---|---|---|
| name | type | offset from beginning of storage |
| inimage | PTR(31) | 0 |
| rlbuf | PTR(31) | 4 |
| nlines | FIXED(32) | 8 |
| iwid | FIXED(32) | 12 |
| xskip | FIXED(32) | 16 |
| ncol | FIXED(32) | 20 |
| ncolh | FIXED(16) | 22 |
| lftpad | FIXED(32) | 24 |
| rtpad | FIXED(32) | 28 |
| padclrw | FIXED(32) | 32 |
| padclr | FIXED(8) | 35 |
| imgend | PTR(31) | 36 |
| startline | PTR(31) | 40 |
| p | PTR(31) | 44 |
| lim | FIXED(32) | 48 |
| limh | FIXED(16) | 50 |
| byt | FIXED(32) | 52 |
| bytb | FIXED(8) | 55 |
| runct | FIXED(32) | 56 |
| runcth | FIXED(16) | 58 |
| bitct | FIXED(32) | 60 |
| bitctb | FIXED(8) | 63 |
| ct | FIXED(32) | 64 |
| cth | FIXED(16) | 66 |
| svw | FIXED(32) | 68 |
| linelen | FIXED(32) | 72 |
| ormask | FIXED(32) | 76 |
| t | FIXED(32) | 80 |
| tb | FIXED(8) | 83 |
| wbits(256) | FIXED(8),indexed | 84 |
| bbits(256) | FIXED(8),indexed | 340 |

| Variable based on the pointer "b0" | | |
|---|---|---|
| name | type | offset from b0 |
| imgbyte | FIXED(8) | 0 |

| Variables based on the pointer "rlbuf" | | |
|---|---|---|
| name | type | offset from rlbuf |
| rc | FIXED(16) | 0 |
| runends(N) | FIXED(16),indexed | 2 |

| Variable based on the pointer "p" | | |
|---|---|---|
| name | type | offset from p |
| pword | FIXED(32) | 0 |

The lookup tables "wbits" and "bbits" are initialized with the following values:

```
wbits: 8 7 6 6 5 5 5 5 4 4 4 4 4 4 4 4
       3 3 3 3 3 3 3 3 3 3 3 3 3 3 3 3
       2 2 2 2 2 2 2 2 2 2 2 2 2 2 2 2
       2 2 2 2 2 2 2 2 2 2 2 2 2 2 2 2
       1 1 1 1 1 1 1 1 1 1 1 1 1 1 1 1
       1 1 1 1 1 1 1 1 1 1 1 1 1 1 1 1
       1 1 1 1 1 1 1 1 1 1 1 1 1 1 1 1
       1 1 1 1 1 1 1 1 1 1 1 1 1 1 1 1
       0 0 0 0 0 0 0 0 0 0 0 0 0 0 0 0
       0 0 0 0 0 0 0 0 0 0 0 0 0 0 0 0
       0 0 0 0 0 0 0 0 0 0 0 0 0 0 0 0
       0 0 0 0 0 0 0 0 0 0 0 0 0 0 0 0
       0 0 0 0 0 0 0 0 0 0 0 0 0 0 0 0
```

```
              0 0 0 0 0 0 0 0 0 0 0 0 0 0 0 0
              0 0 0 0 0 0 0 0 0 0 0 0 0 0 0 0
              0 0 0 0 0 0 0 0 0 0 0 0 0 0 0 0
      bbits:  0 0 0 0 0 0 0 0 0 0 0 0 0 0 0 0
              0 0 0 0 0 0 0 0 0 0 0 0 0 0 0 0
              0 0 0 0 0 0 0 0 0 0 0 0 0 0 0 0
              0 0 0 0 0 0 0 0 0 0 0 0 0 0 0 0
              0 0 0 0 0 0 0 0 0 0 0 0 0 0 0 0
              0 0 0 0 0 0 0 0 0 0 0 0 0 0 0 0
              0 0 0 0 0 0 0 0 0 0 0 0 0 0 0 0
              0 0 0 0 0 0 0 0 0 0 0 0 0 0 0 0
              1 1 1 1 1 1 1 1 1 1 1 1 1 1 1 1
              1 1 1 1 1 1 1 1 1 1 1 1 1 1 1 1
              1 1 1 1 1 1 1 1 1 1 1 1 1 1 1 1
              1 1 1 1 1 1 1 1 1 1 1 1 1 1 1 1
              2 2 2 2 2 2 2 2 2 2 2 2 2 2 2 2
              2 2 2 2 2 2 2 2 2 2 2 2 2 2 2 2
              3 3 3 3 3 3 3 3 3 3 3 3 3 3 3 3
              4 4 4 4 4 4 4 4 5 5 5 5 6 6 7 8
```

Since the language in which this program is written employs forward Polish notation, an end-of-statement symbol (such as the ";" in PL/I) is unnecessary in most cases.

All array indices are expressed as offsets in bytes from the beginning of the array.

The following subroutine is assumed to be available:

```
copy(DEST,SOURCE,N)    copies N bytes from
                       SOURCE to DEST
procedure toruns(argpt);
call copy(addr inimage,argpt,36)
b0= +inimage srl xskip 3
xskip=and xskip 7
t= + —ncol +lftpad rtpad xskip
linelen=srl t 3
ormask=srl 1 (and t 7)
imgend= +b0 *nlines iwid
lim= —ncol rtpad
t=0
begin
startline=b0
p= +b0 linelen
svw=pword
pword=and (or pword ormask) X'FFFFFF00'
ct=lftpad
runends(0)=0
runends(2)=0
runct=4
byt=0
bytb=imgbyte
b0= +b0 1
bitct=xskip
byt=sll byt bitct
byt=and byt X'000000FF'
if lftpad— =0
  runends 4=0
  runends 6=0
  if padclr=0
  goto startwhite
  else
  runct= +runct 4
  if byt lgt X'0000007F'
  goto startblack
  end
  end
end
begin
runends(runct)=cth
label startwhite
if byt=0
ct= — +ct 8 bitct
bitct=0
begin
if imgbyte— =0
leave
end
```

```
ct= +ct 8
b0= +b0 1
repeat
end
bytb=imgbyte
b0= +b0 1
end
tb=wbits(byt)
ct= +ct t
byt=sll byt t
bitct= +bitct t
runends(+runct 2)=cth
runct= +runct 4
label startblack
tb=bbits(byt)
ct= +ct t
bitct= +bitct t
byt=and (sll byt t) X'000000FF'
if bitct=8
if imgbyte=255
begin
ct= +ct 8
b0= +b0 1
if imgbyte=255
repeat
end
end
if ct>lim
leave
end
end
bytb=imgbyte
b0= +b0 1
bitctb=bbits(byt)
ct= +ct bitct
byt=and (sll byt bitct) X'000000FF'
end
repeat
end
if ncol— =lim
if padclr=0
if runends(—runct 2)<limh
runends(runct)=limh
runends(+runct 2)=ncolh
runct= +runct 4
else
runends(—runct 2)=ncolh
end
end
end
runends(runct)=ncolh
runends(+runct 2)=ncolh
runends(+runct 4)=ncolh
runct= +runct 8
rc=runcth
rlbuf= +rlbuf runct
pword=svw
b0= +startline iwid
if b0<imgend
repeat
end
end
end
```

Thus, while the invention has been described with reference to preferred embodiments thereof, it will be understood by those skilled in the art that various changes in form and details may be made without departing from the scope of the invention.

What is claimed is:

1. A method for converting an image stored as a bit map in binary form, with alternating bit strings of either of two types, to a run representation form, comprising the steps of:

(a) segmenting a first line of bit strings of said bit map into units of equal number of bits for use in indexing lookup tables;

(b) creating a first lookup table which contains, for each possible unit used as an index value, the number of leading bits in the unit which are of the first binary type;

(c) creating a second lookup table which contains, for each possible unit used an an index value, the number of leading bits in the unit which are of the second binary type;

(d) converting the first line of said image to run representation form by the steps of:

(1) converting the first bit string in said first line to a run representation by:

(i) determining the length of said first bit string by using the first and successive units as indices to said first lookup table to obtain the number of leading bits in each unit which belong to said first bit string until a unit is found wherein not all of the bits belong to said first string;

(ii) storing the run representation of said first string in a run representation buffer; and (iii) modifying said unit wherein not all of the bits belong to said first string by discarding those leading bits in said unit that belong to said first bit string and shifting the remaining image bits to the leading bit positions in said modified unit while introducing non-image bits in the trailing positions;

(2) converting the second bit string in said line to a run representation by:

(i) determining the length of said second bit string by using said modified unit, ignoring said non-image bits, and successive units as indices to said second lookup table to obtain the number of leading bits in each unit which belong to said second bit string until a unit is found wherein not all of the bits belong to said second string;

(ii) storing the run representation of said second string in said run representation buffer; and (iii) modifying said unit wherein not all of the bits belong to said second string by discarding those leading bits in said unit that belong to said second bit string and shifting the remaining image bits to the leading bit positions in said modified unit while introducing non-image bits in the trailing positions;

(3) repeating said steps of converting for successive bit strings until all of the bit strings in said first line have been stored in run representation form in said run representation buffer; and (e) repeating the steps of segmenting and converting for successive lines to the end of the image.

2. A method according to claim 1, further comprising the step of:

inserting a representation of additional bits as padding at the beginning of the bit string run representations in said run representation buffer in accordance with a predetermined format.

3. A method according to claim 1, further comprising the step of:

testing contiguous units to determine if all their bits have a same value to reduce processing time for long strings.

4. A method according to claim 1, wherein said step of converting further comprises converting bit strings to run representation form in pairs consisting of one run of said first binary type and a second run of said second binary type, utilizing knowledge of the type of a particular bit string being converted to improve processing efficiency.

5. A method according to claim 1 further comprising the step of: assigning first and second address pointers to locate bit string data and run representation data for each run.

6. A method according to claim 1, further comprising the step of inserting a representation of additional bits as padding at the end of the bit string run representations in said run representation buffer in accordance with a predetermined format.

7. A method according to claim 1 wherein said run representations comprise run ends.

8. A method according to claim 1 wherein said run representations comprise run lengths.

9. A method according to claim 1 further comprising the step of storing a representation of the length of the run representation buffer in the run representation buffer.

10. A method according to claim 1 further comprising the step of storing three zero run representations in the run representation buffer prior to storing the bit string run representations.

11. A method according to claim 1 further comprising the step of storing the run representations in pairs with the first representation of each pair representing a run of said first binary type and the second representation representing a run of said second binary type.

12. A method according to claim 1 further comprising the step of storing a copy of the run representation of the last bit string in said run representation buffer.

13. Apparatus for converting an image stored as a bit map in binary form, with alternating bit strings of either of two types, to a run representation form, comprising:

means for segmenting a first line of bit strings into units of equal numbers of bits for use in indexing lookup tables;

lookup table means for containing, for each possible unit used as an index value, the number of leading bits in each unit which are of the first binary type and the number of leading bits in each unit which are of the second binary type;

means for converting the first bit string in said first line to a run representation by using the first and successive units as indices to said lookup table means to obtain the number of leading bits in each unit which belong to said first bit string until a unit is found wherein not all of the bits belong to said first string, indicating the end of said first string has been encountered;

buffer means for storing run representations;

means for storing the run representation of said first bit string in said run representation buffer means when the end of said string is encountered; means for modifying said unit wherein not all of the bits belong to said first bit string by discarding those leading bits in said unit that belong to said first bit string and shifting the remaining image bits to the leading bit positions in said modified unit while introducing non-image bits in the trailing positions;

means for converting the second bit string to a run representation by using the said modified unit, ignoring said non-image bits, and successive units as indices to said lookup table means to obtain the number of leading bits in each unit which belong to said second bit string until a unit is found wherein not all of the bits belong to said second string;

means for storing the run representation of said second string in said run representation buffer means;

means for modifying said unit wherein not all of the bits belong to said second bit string by discarding those leading bits in said unit that belong to said second bit string and shifting the remaining image bits to the leading bit positions in said modified unit while introducing non-image bits in the trailing positions; and means for actuating said segmenting, converting, modifying, and storing means for successive bit strings in said first line and each following line to the end of the image.

14. Apparatus as in claim 13 wherein said run representation buffer means comprises a run representation buffer for each line of image data.

15. Apparatus as in claim 14 further comprising means for storing a representation of the length of each run representation buffer in the respective run representation buffer.

16. Apparatus as in claim 14 further comprising means for storing three zero run representations in each run representation buffer prior to storing the bit string run representations therein.

17. Apparatus as in claim 14 further comprising means for storing the run representations in pairs with the first representation of each pair representing a run of said first binary type and the second element representing a run of said second binary type.

18. Apparatus as in claim 14 further comprising means for storing a copy of the run representation of the last bit string in each run representation buffer.

19. Apparatus as in claim 13, further comprising means for testing contiguous units to determine if all their bits have a same value to reduce processing time for long strings.

* * * * *